(12) United States Patent
Haluzak et al.

(10) Patent No.: US 7,417,307 B2
(45) Date of Patent: Aug. 26, 2008

(54) SYSTEM AND METHOD FOR DIRECT-BONDING OF SUBSTRATES

(75) Inventors: Charles C Haluzak, Corvallis, OR (US); Arthur Piehl, Corvallis, OR (US); Chien-Hua Chen, Corvallis, OR (US); Jennifer Shih, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 283 days.

(21) Appl. No.: 11/192,377

(22) Filed: Jul. 29, 2005

(65) Prior Publication Data

US 2007/0026559 A1 Feb. 1, 2007

(51) Int. Cl.
*H01L 23/20* (2006.01)
(52) U.S. Cl. ..................... 257/682; 257/704
(58) Field of Classification Search .......... 257/682, 257/777, 85, 621, 774, 704; 438/109
See application file for complete search history.

(56) References Cited

U.S. PATENT DOCUMENTS

| | | | | |
|---|---|---|---|---|
| 4,357,557 A * | 11/1982 | Inohara et al. | .......... | 313/509 |
| 5,188,983 A * | 2/1993 | Guckel et al. | .......... | 438/53 |
| 5,324,888 A * | 6/1994 | Tyler et al. | .......... | 174/536 |
| 5,589,082 A * | 12/1996 | Lin et al. | .......... | 216/2 |
| 5,723,904 A * | 3/1998 | Shiga | .......... | 257/698 |
| 5,822,170 A | 10/1998 | Cabuz et al. | | |
| 6,093,577 A | 7/2000 | Van der Groen et al. | | |
| 6,180,536 B1 * | 1/2001 | Chong et al. | .......... | 438/745 |
| 6,297,072 B1 | 10/2001 | Tilmans et al. | .......... | 438/106 |
| 6,303,986 B1 * | 10/2001 | Shook | .......... | 257/680 |
| 6,316,332 B1 | 11/2001 | Lo et al. | | |
| 6,323,834 B1 * | 11/2001 | Colgan et al. | .......... | 345/84 |
| 6,335,224 B1 | 1/2002 | Peterson et al. | | |
| 6,455,398 B1 | 9/2002 | Fonstad, Jr. et al. | | |
| 6,469,909 B2 | 10/2002 | Simmons | | |
| 6,470,594 B1 * | 10/2002 | Boroson et al. | .......... | 34/335 |
| 6,518,600 B1 * | 2/2003 | Shaddock | .......... | 257/98 |
| 6,555,904 B1 | 4/2003 | Karpman | | |
| 6,559,530 B2 | 5/2003 | Hinzel et al. | | |
| 6,576,489 B2 | 6/2003 | Leung et al. | | |
| 6,589,625 B1 | 7/2003 | Kothari et al. | | |
| 6,660,614 B2 | 12/2003 | Hirschfeld et al. | | |
| 6,664,779 B2 * | 12/2003 | Lopes et al. | .......... | 324/158.1 |
| 6,674,140 B2 | 1/2004 | Martin | | |
| 6,713,828 B1 * | 3/2004 | Chavan et al. | .......... | 257/415 |
| 6,844,959 B2 | 1/2005 | Huibers et al. | | |
| 6,858,911 B2 | 2/2005 | Tamura et al. | | |
| 6,872,902 B2 * | 3/2005 | Cohn et al. | .......... | 200/181 |
| 6,872,984 B1 * | 3/2005 | Leung | .......... | 257/81 |
| 6,879,147 B2 * | 4/2005 | Lopes et al. | .......... | 324/158.1 |

(Continued)

OTHER PUBLICATIONS

W. Fadgen, "Electrical Properties of TEOS in MIM Structures," National Nanofabrication Users Network, pp. 46-47.

(Continued)

*Primary Examiner*—M. Wilczewski
*Assistant Examiner*—Swapneel Chhaya

(57) ABSTRACT

A method of forming a MEMS (Micro-Electro-Mechanical System), includes forming an ambient port through a MEMS cap which defines a cavity containing a plurality of MEMS actuators therein; and bonding a lid arrangement to the MEMS cap to hermetically seal the ambient port.

11 Claims, 11 Drawing Sheets

U.S. PATENT DOCUMENTS

| | | | |
|---|---|---|---|
| 6,900,072 B2 * | 5/2005 | Patel et al. | 438/106 |
| 6,900,510 B2 | 5/2005 | Tamura et al. | |
| 6,902,947 B2 | 6/2005 | Chinn et al. | |
| 6,903,860 B2 * | 6/2005 | Ishii | 359/290 |
| 6,906,847 B2 * | 6/2005 | Huibers et al. | 359/291 |
| 6,917,099 B2 * | 7/2005 | Hellekson et al. | 257/678 |
| 7,019,886 B2 * | 3/2006 | Chen et al. | 359/290 |
| 7,042,623 B1 * | 5/2006 | Huibers et al. | 359/291 |
| 7,045,885 B1 * | 5/2006 | Chen et al. | 257/678 |
| 7,087,134 B2 * | 8/2006 | Chen et al. | 156/281 |
| 7,204,737 B2 * | 4/2007 | Ding et al. | 445/24 |
| 7,307,773 B2 * | 12/2007 | Chen et al. | 359/290 |
| 2002/0113296 A1 * | 8/2002 | Cho et al. | 257/659 |
| 2004/0061207 A1 * | 4/2004 | Ding | 257/678 |

OTHER PUBLICATIONS

M. Laczka, et al., Application of Sol-Gel Method to Obtain Various Types of Materials, 1 page.

* cited by examiner

SYSTEM AND METHOD FOR DIRECT-BONDING OF SUBSTRATES

BACKGROUND OF THE INVENTION

The present invention relates generally to the field of bonding of substrates. In particular, the invention relates to methods of fabricating MEMS (Micro-Electro-Mechanical Systems) and other devices which enable the operability and/or longevity of the devices.

MEMS and other devices often include two or more substrates either in close proximity or bonded together. For example, in optical systems such as digital projectors, a device may include an interference-based digital light display (DLD) package which includes two or more substrates to direct light to and from the DLD. Similar to a CRT, in a rear-projection television, a DLD can be used in digital projectors for processing or generating an image from a source light.

One such DLD package is illustrated in FIG. 1. The package 100 includes a base substrate 120 with a driving electrode (not shown), a pixel plate 110 which can move vertically, and a thin protective substrate or membrane 130. In this arrangement a reflective coating is provided on the pixel plate 110, and a partial reflective coating 131 is provided on the bottom surface of the membrane 130. The protective membrane 130 encloses a cavity in which the DLD pixel plate 110 is enclosed and allows light to pass therethrough.

To ensure reliability of the DLD package, the cavity must be essentially free of contaminants and, in particular, essentially free of moisture. In this regard, such DLD packages are generally formed in a highly controlled environment so that moisture in the cavity is minimized. However, these methods can substantially increase the manufacturing costs of the DLD package.

Thus, it is desirable to provide a reliable and inexpensive method and system of assembling such packages so that the effect of the contaminants is minimized and the prolonged operation of the DLD package is promoted.

SUMMARY OF THE INVENTION

One embodiment of the invention relates to a method of forming a MEMS (Micro-Electro-Mechanical System), comprising: forming an ambient port through a MEMS cap which defines a cavity, the cavity containing a plurality of MEMS actuators therein; and bonding a lid arrangement to the MEMS cap to hermetically seal the ambient port.

Another embodiment of the invention relates to a MEMS package wherein the MEMS package, comprises: a MEMS cap forming a cavity, the cavity containing a plurality of MEMS actuators therein; an ambient port formed through the MEMS cap; and a lid arrangement bonded to the MEMS cap, to hermetically close the ambient port.

In another embodiment, a digital projector includes a MEMS package wherein the digital projector, comprises: a MEMS package which comprises: a MEMS cap forming a cavity, the cavity containing a plurality of MEMS actuators therein, the MEMS cap having an ambient port therethrough; and a lid arrangement bonded to the MEMS cap.

In yet another embodiment, the invention relates to a MEMS package which comprises a MEMS cap means for forming a cavity which encloses a plurality of MEMS actuators therein, ambient port means formed in the MEMS cap for providing fluid communication with the cavity; a lid arrangement bonded to the MEMS cap; and means for protecting the plurality of MEMS actuators from contaminants trapped in the cavity.

It is to be understood that both the foregoing general description and the following detailed description are exemplary and exemplary only, and are not restrictive of the invention as claimed.

DETAILED DESCRIPTION OF CERTAIN EMBODIMENTS

Figure 1:
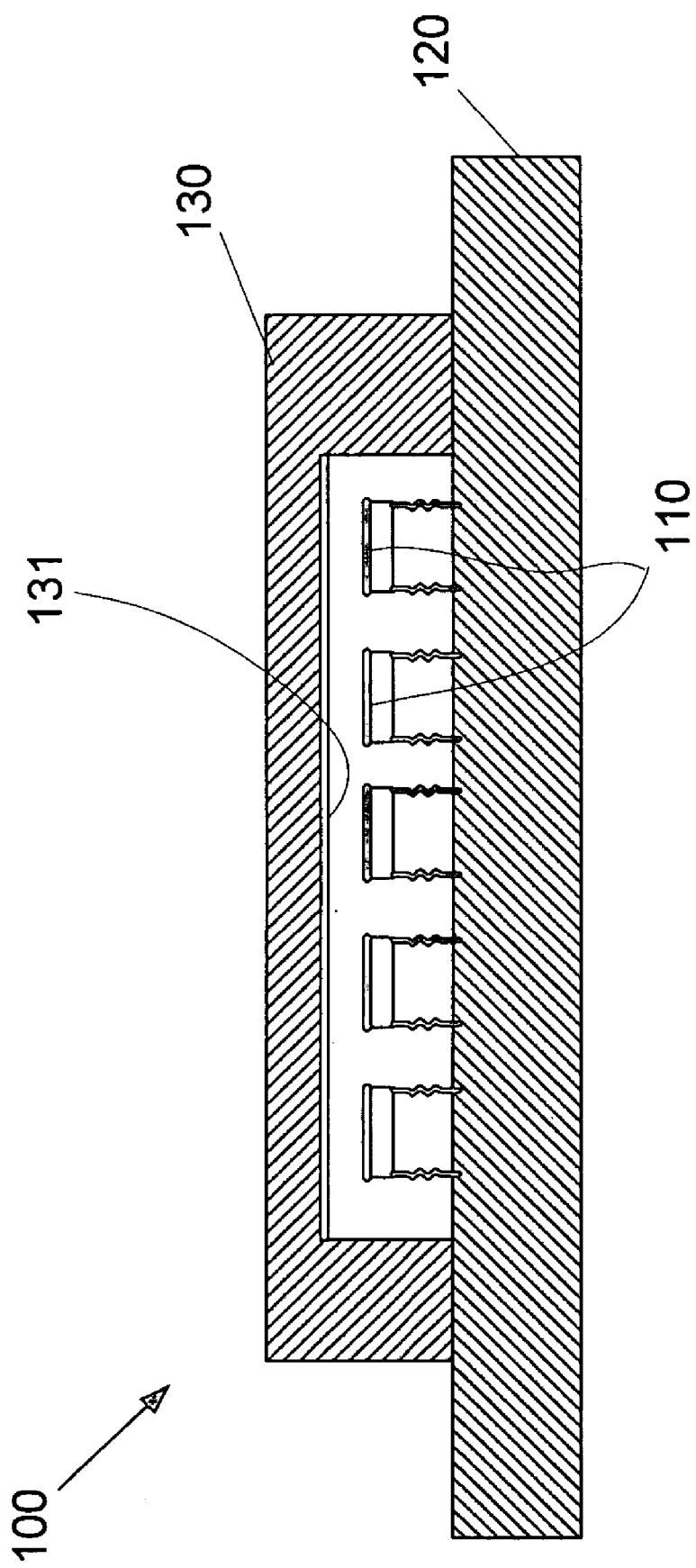
FIG. 1 is a cross-sectional view of a prior art MEMS device.
Figure 2:
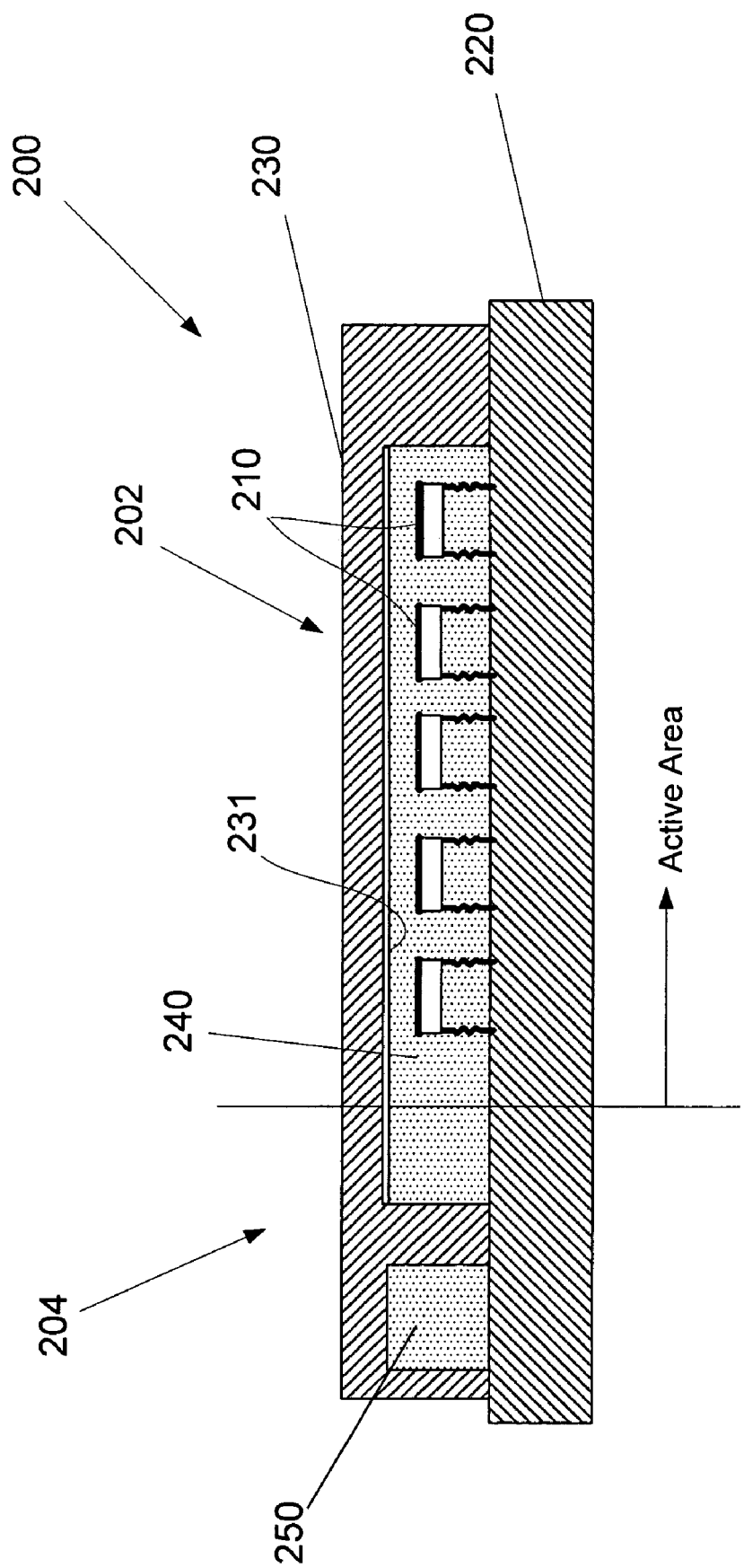
FIGS. 2 to 7 illustrate the formation of a MEMS device according to an embodiment of the invention.

Referring to FIG. 2, a cross-sectional view of a package according to an embodiment of the invention is illustrated. In one embodiment, the package 200 includes an image processing device for use in a digital projector. The package 200 includes an exemplary digital light display (DLD) device with a plurality of MEMS actuators, such as pixel plates 210, mounted on a support base 220. The pixel plates 210 may be arranged in a two-dimensional array. Of course, other optical devices may be used, such as a liquid crystal display (LCD) or liquid crystal on silicon (LCOS), for example. Such optical devices are well known to those skilled in the art and do not require further discussion for purposes of this application. While the package 200 in the illustrated embodiment is an optical device, it will be understood by those skilled in the art that the invention is not limited to optical devices and may include other devices having two or more substrates and an enclosed cavity.

The support base 220 may be made of a variety of materials, such as a semiconductor or a non-conductive substrate, and may have a thickness selected to provide sufficient strength to support the DLD pixel plates 210. The material and thickness of the support base 220 is not limiting on the invention.

Figure 3:
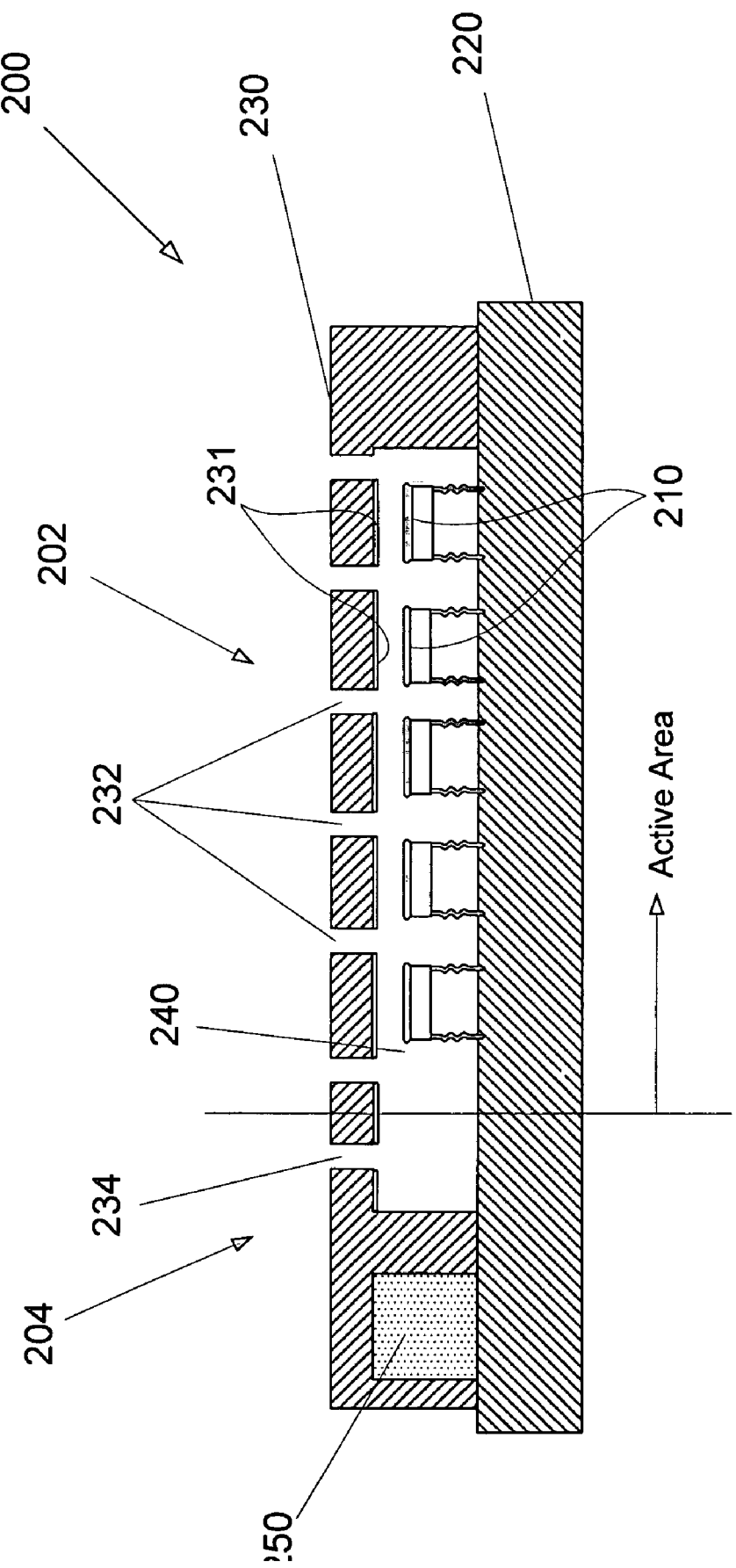

At an initial step illustrated in FIG. 3, the pixel plates 210 are encased by a protective membrane 230 mounted on the support base 220. The protective membrane 230 can be made of a variety of materials. In one embodiment, the protective membrane 230 is silicon dioxide formed using tetraethylorthosilicate (TEOS). The protective membrane 230 has a partially reflective coating 231 on its inboard or bottom surface. This partially reflective coating reflects a portion of the light and allows the remaining portion of incoming light to pass therethrough. The light which passes through the coating 231 is reflected back from the pixel plates 210. The two reflections then cooperate to generate a desired interference effect which varies with the gap between the pixel plates 210 and the protective membrane 230, and thus enables different colors to be generated.

The protective membrane 230 may have a known refractive index (RI). In the case TEOS oxide is used in the fabrication of the silicon dioxide, the protective membrane 230 has an RI of approximately 1.5. In one embodiment, the protective membrane 230 has a thickness of between 0.5 and 2.0 microns at least in the region above the pixel plates 210.

The pixel plates 210 are positioned in an active area 202 of the package 200. The active area 202 is configured to receive incoming light and process the light, via the pixel plates 210, to generate pixels which can be used to compose an image, for example. The package 200 extends into an inactive area 204 in which no light is actively processed by the MEMs but wherein it is overshadowed by a light absorbing layer such as a layer which is optically black or nearly 100% light absorbing—see black layer 262 in FIG. 4 for example.

The protective membrane 230 forms a cavity 240 which may be filled with a sacrificial material to secure the pixel plates 210 in position and to prevent damage during transportation and/or assembly. In one embodiment, the sacrificial material in the cavity 240 is amorphous silicon. In the inactive area, a second cavity 250 is filled with a material. The material in the second cavity 250 may also be amorphous silicon but is not intended to be sacrificial. The second cavity 250 and the material therein can facilitate the setting of the height of the protective membrane 230 and thus the height of the boding surface across sustantially the entire chip.

Referring now to FIG. 3, clear-out holes are etched through the protective membrane 230. The clear-out holes 232 may be etched using a variety of processes, such as chemical etching or laser etching using a mask. In one embodiment, the holes are etched substantially above the streets separating the rows and columns of the two-dimensional array of pixel plates 210.

The clear-out holes 232 are used to remove the sacrificial material from the cavity 240. The removing of the sacrificial material may also be achieved in a variety of ways. These include chemical techniques such as using liquid HF (hydrofluoric acid), TMAH (tetramethylammonium hydroxide) or xenon difluoride ($XeF_2$). In the case wherein the sacrificial material is amorphous silicon or some form of silicon, the use of xenon difluoride is possible. The process is not a plasma process but a simple gas flowing technique wherein the gas is used to remove the sacrificial material from even very restricted small spaces and/or areas.

In addition to the clear-out holes 232, an ambient port 234 is etched in the protective membrane 230 above an inactive area 204 of the package 200.

Figure 4:
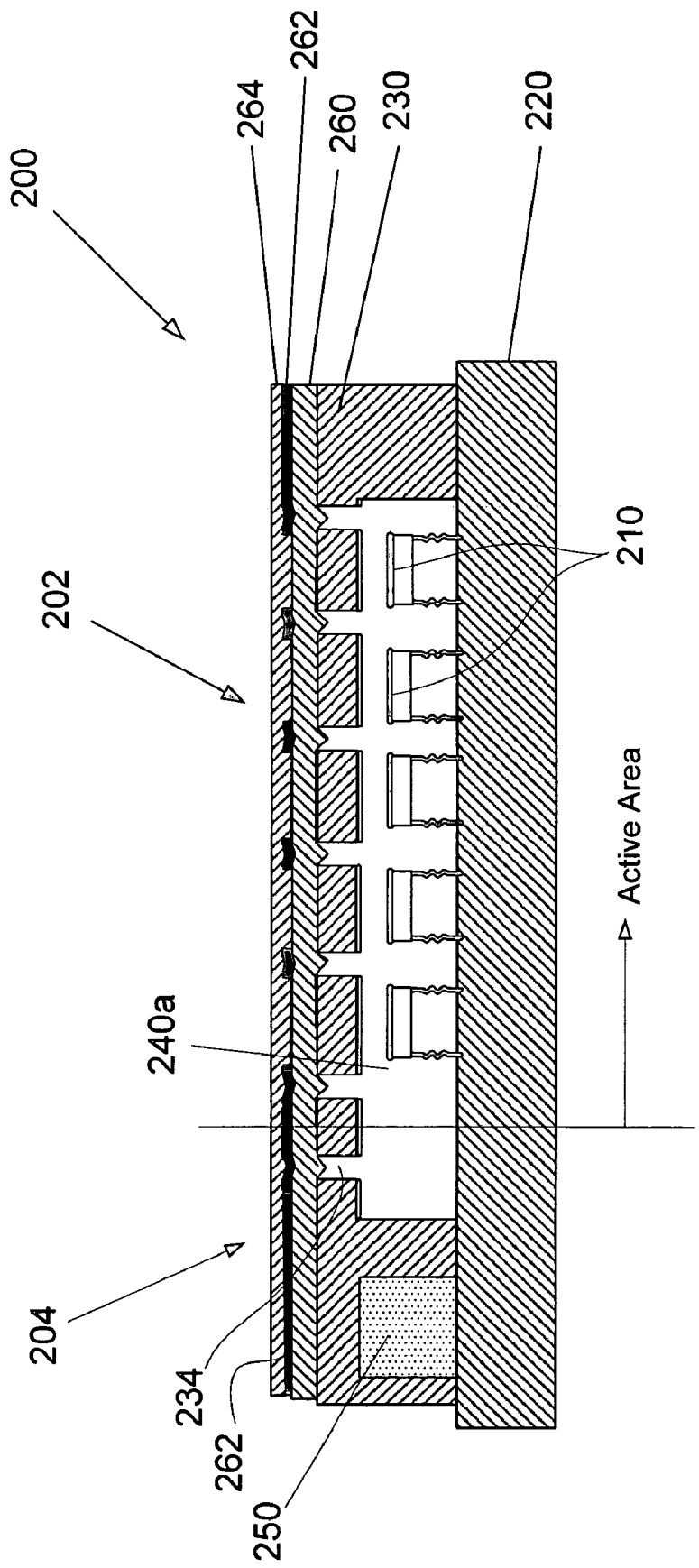

Next, as illustrated in FIG. 4, a layer 260 of a material, such as an oxide, is formed on top of the protective membrane 230. The layer 260 may be formed by any of a variety of ways. In one embodiment, the layer 260 is deposited over the protective membrane 230, including the clear-out holes 232 and the ambient port 234.

In a particular embodiment, the above-mentioned black layer 262 of light-absorbent material which is referred to a hide or HID, is formed on selected portions of the package. Specifically, the black layer 262 is positioned above all regions except the pixel plates 210. The light-absorbent material of the black layer 262 serves to reduce or eliminate undesirable incidental light images reflected from the support base 220 or other components. A predetermined clearance may be provided around the pixel plates 210 upon which the black layer is not positioned. The clearance allows for an angle of incidence and of reflection of the incoming light, for example.

A capping layer 264 is disposed over the black layer 262 in the manner shown in FIG. 4. In one embodiment, the capping layer 264 is formed using TEOS oxide. Examples of other materials are PECVD (Plasma Enhanced Chemical Vapor Deposition) silane based oxide or sputtered deposited silicon oxide or silicon dioxide.

The capping layer 264 is then polished to Angstrom-level flatness via chemical-mechanical polishing (CMP), for example. The layers 260, 262, 264 combine with the protective layer 230 to form a MEMS cap.

Figure 5:
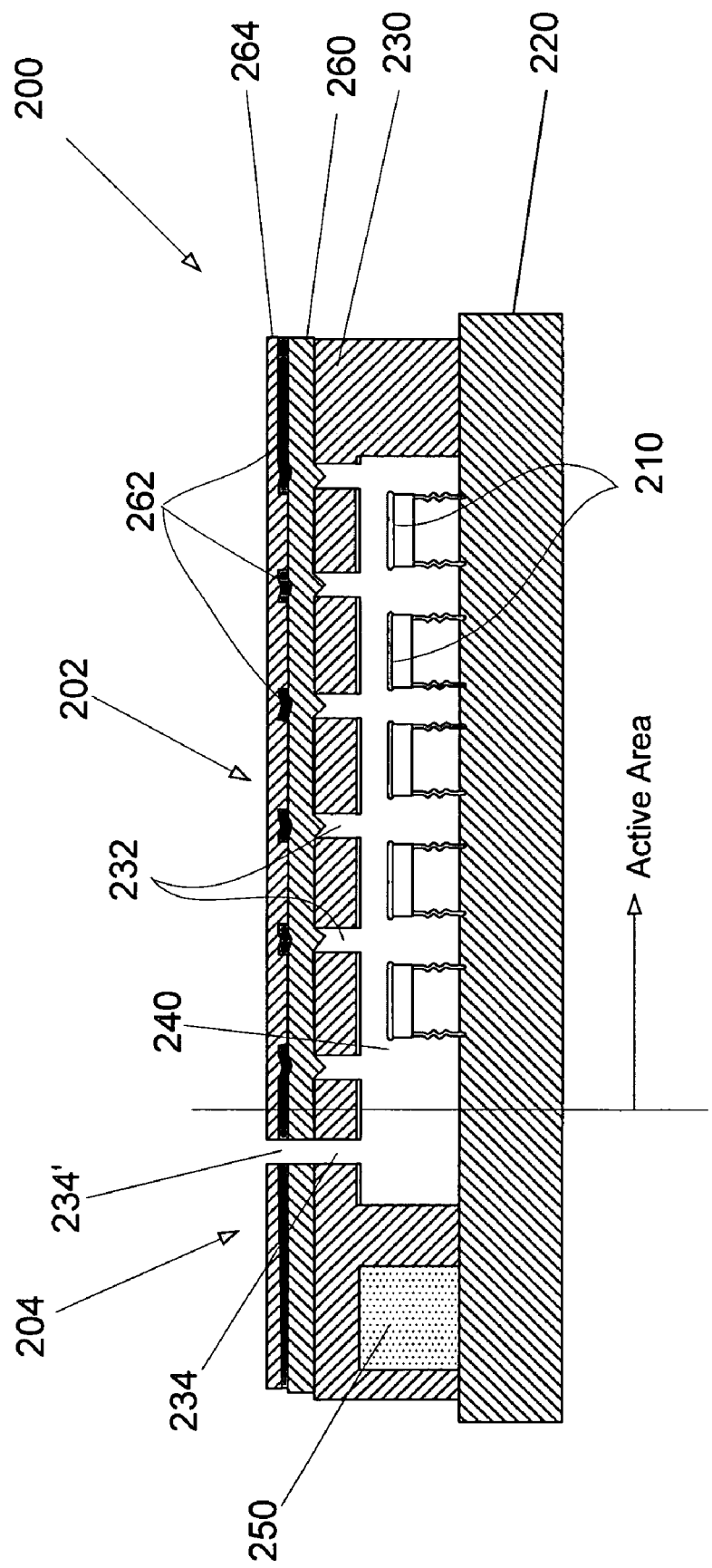

Referring now to FIG. 5, the portions of the layers 260, 262, 264 above the ambient port 234 are etched away to form an extension 234' of the ambient port 234. Again, the etching of these layers may be achieved via a suitable etching technique.

It should be noted that the provision of the ambient port is such as to allow the pressure and atmosphere in the cavity 240 to be controlled right up until the ambient port and its extension are permanently closed. This allows the pressure to be atmospheric, sub-atmospheric or above atmospheric as desired. It also allows the content of the atmosphere to be controlled. For example, the cavity 240 can be filled with nitrogen, or argon, for example, immediately prior the closure of the ambient port and thus improve MEMS functionality and/or reliablity.

Figure 6:
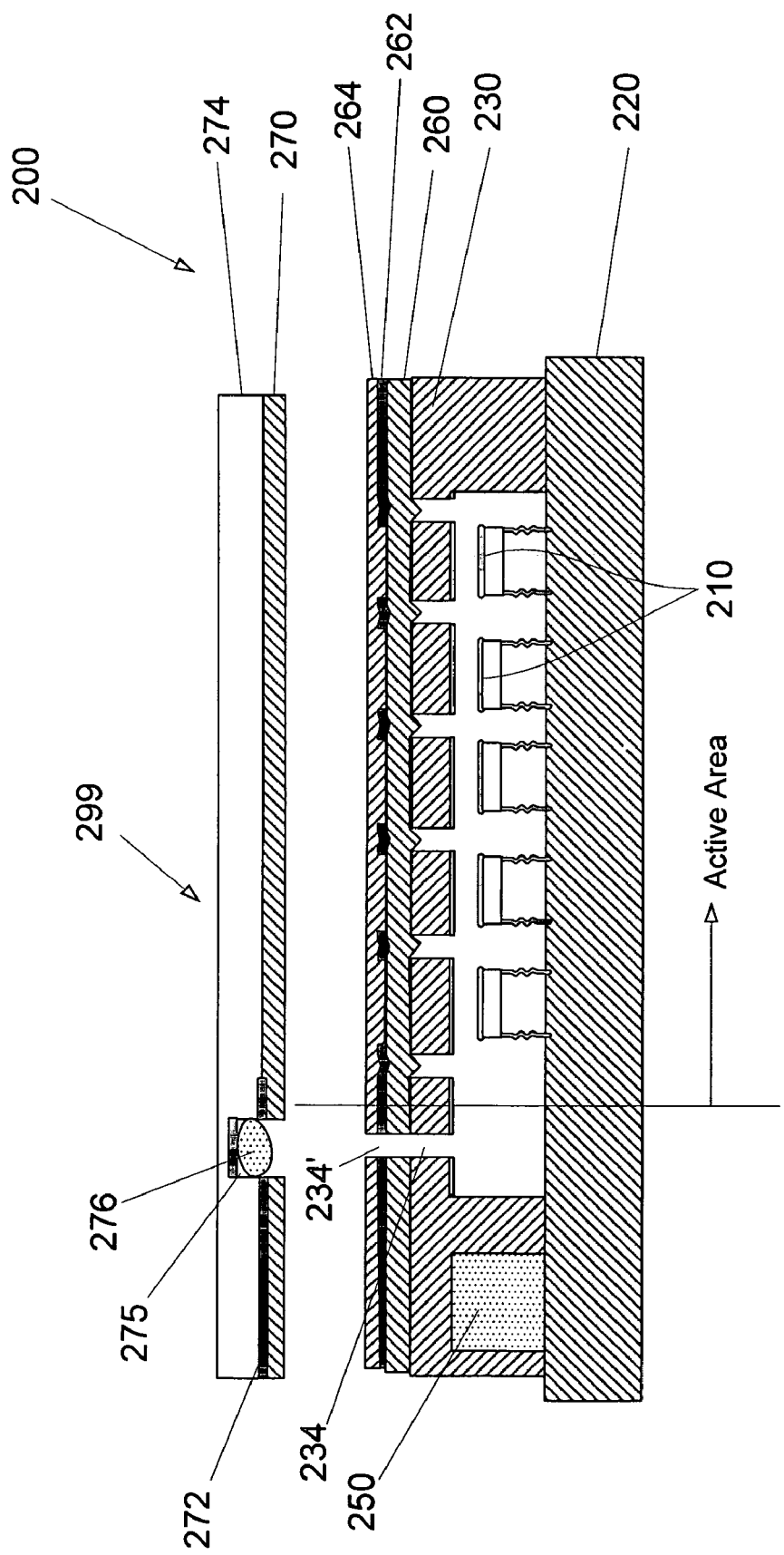
Figure 7:
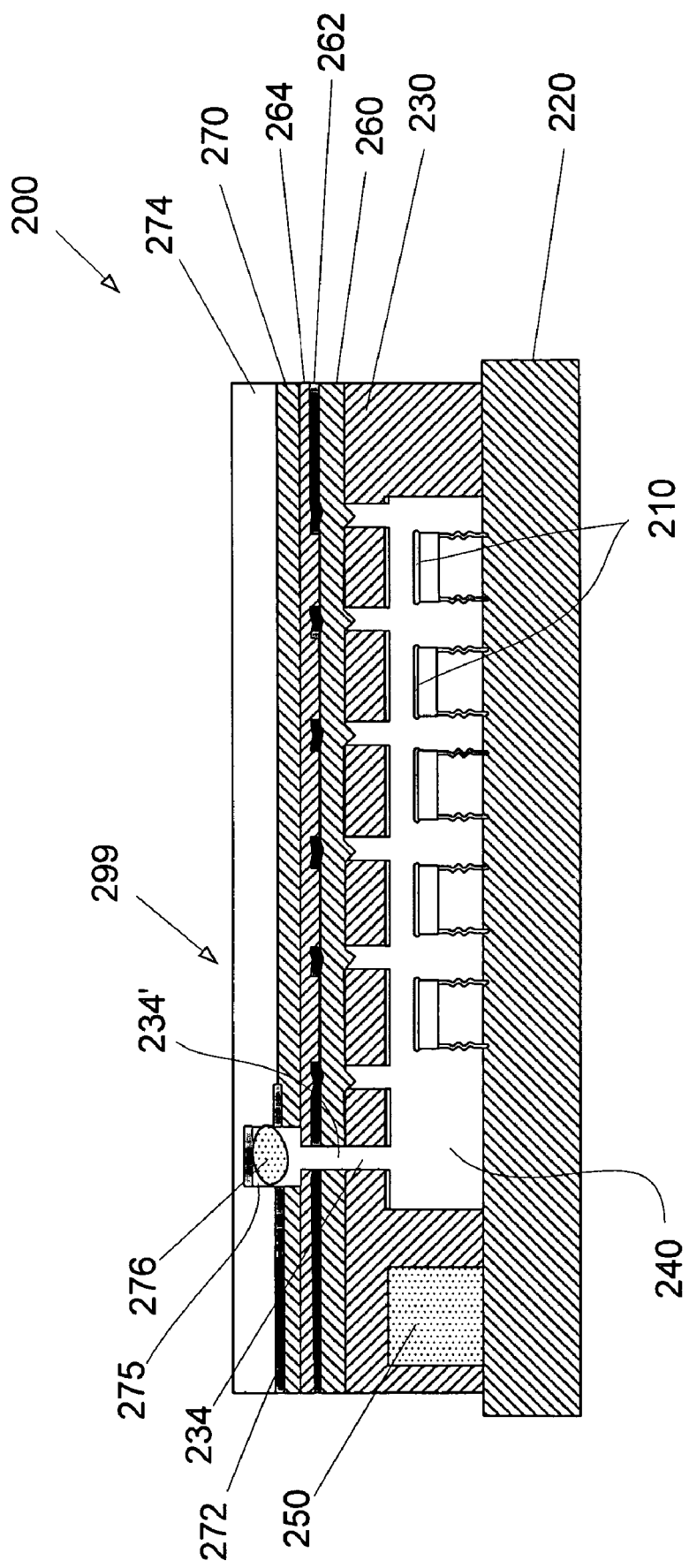

Referring now to FIGS. 6 and 7, the bonding of a lid arrangement 299 to the capping layer 264 of the MEMS cap is illustrated. As illustrated in FIG. 6, a black (hide) layer 272 can be additionally deposited onto an area of a lid 274 corresponding substantially to the inactive area of the device 200, if deemed necessary.

The lid 274 may be formed of a glass. The black layer 272 can also be deposited onto the surface of a cavity 275 formed in the lid 274, in which a contaminant absorbing material 276 such as water absorbing desiccant or a getter which absorbs other forms of contaminants, is positioned. The material 276 may, of course, be a getter or desiccant, or the like. In one embodiment, the material comprises silica gel (silicon dioxide) and is used to scavenge unwanted molecules, such as water vapor molecules.

A layer of bonding substrate material 270, such as TEOS oxide, amorphous silicon, phosphosilicate glass (PSG), glass frit, or silicon nitride is deposited onto a bonding surface of the lid 274. The bonding substrate material 270 may be deposited through a variety of methods such as sputtering, chemical vapor deposition (CVD), or screen print, for example. The layer of bonding substrate material 270 is relatively thin having a thickness on the order of between tens of an angstrom and tenths of a micron. In one embodiment, an anti-reflective coating is applied to the opposite surface (the upper surface as seen in FIG. 6 2E) of the lid 274.

The bonding surfaces, including the capping layer 264 and the surface of the lid 274 with the bonding substrate material 270, may be polished for smoothness. In this regard, the capping layer 264 and the surface of the lid 274 with the bonding substrate material 270 may be polished to Angstrom-level flatness via CMP, for example.

The bonding site (silanol group) density of at least one of the bonding surfaces is increased to provide a more secure bonding of the substrates. The bonding site density may be increased through, for example, plasma treatment and an optional wet treatment with either de-ionized water or SC1 (Standard Clean 1) chemistry. In this regard, the bond density of the capping layer 264 or the layer of bonding substrate material 270 on the lid 274 may be increased through any of a variety of methods including plasma treatment, ion implant and physical sputtering. In a particular embodiment, the bonding site density is increased for both surfaces. The increase in bonding site density effectively increases the bond strength of the pair.

In one embodiment, the bonding site density is increased by plasma treating the bonding surfaces. This may be accomplished through, for example, an ion beam sputtering process, a reactive ion etcher, striking plasma onto the bonding surface, ion implantation or ion bombardment. The plasma treatment may use $O_2$, $N_2$ or Ar plasma or combinations thereof, for example. The gases may be introduced serially or in various mixtures or combinations of mixtures. In one emboidment, $O_2$ is introduced intially for a short period (e.g. 15-25 seconds) to produce a little oxygen ash and is immediately followed by $N_2$ or the like in the same tool or apparatus.

Following the plasma treatment, the bonding surfaces may be dipped in de-ionized water or SC1 chemistry for a period of time. In this regard, a minute or less is generally sufficient to increase the silanol group (Si—OH) density of the surfaces. For example, dipping for five minutes may be sufficient. The surfaces may then be dried using, for example, a spin-rinse drier. Other methods of increasing bonding site density are well known to those skilled in the art and are contemplated within the scope of the invention.

Referring now to FIG. 7, the bonding surfaces are fusion bonded at room temperature. The fusion bonding may be accomplished by holding the bonding surfaces together while applying a compression force. The increased bonding site density allows the fusion bonding to be performed at substantially room temperature, rather than typical fusion bonding processes which may require annealing temperatures as high as 900° C. "Room temperature," as used herein, includes temperatures ranging between approximately 15 and approximately 40° C.

In one embodiment, the package 200 is annealed. In one embodiment, the lid 274 formed of glass with a thin layer 270 of TEOS oxide bonded to the capping layer 264 formed of TEOS oxide, and the package 200 is annealed at approximately 100-200° C. for approximately two hours, to develop a final bond strength and hermeticity level required.

Thus, the capping layer 264 and the lid 274 are bonded to each other with no need for an anti-reflective coating on the bonding surfaces. The increasing of the silanol-group density through plasma treatment and post-bond annealing provide a bond of sufficient strength to secure the capping layer 264 and the lid 274 to each other. In one embodiment, the lid 274 is formed of glass and has a thickness of between 0.5 and 3 mm for example.

Further, the package 200 may be made hermetically sealed by assuring that the lid 274 is sufficiently thick to prevent moisture or gas molecules to penetrate therethrough. For example, this hermetical sealing can be arranged to meet the military standard MIL STD 883C.

The lid arrangement 299 is positioned such that the cavity 275 containing the absorbent contaminant removing material 276 is in fluid communication with the cavity 240 containing the pixel plates 210 via the ambient port 234. Thus, any vapor molecules in the environment of the pixel plates 210 are scavenged and absorbed by the material 276.

Figure 8:
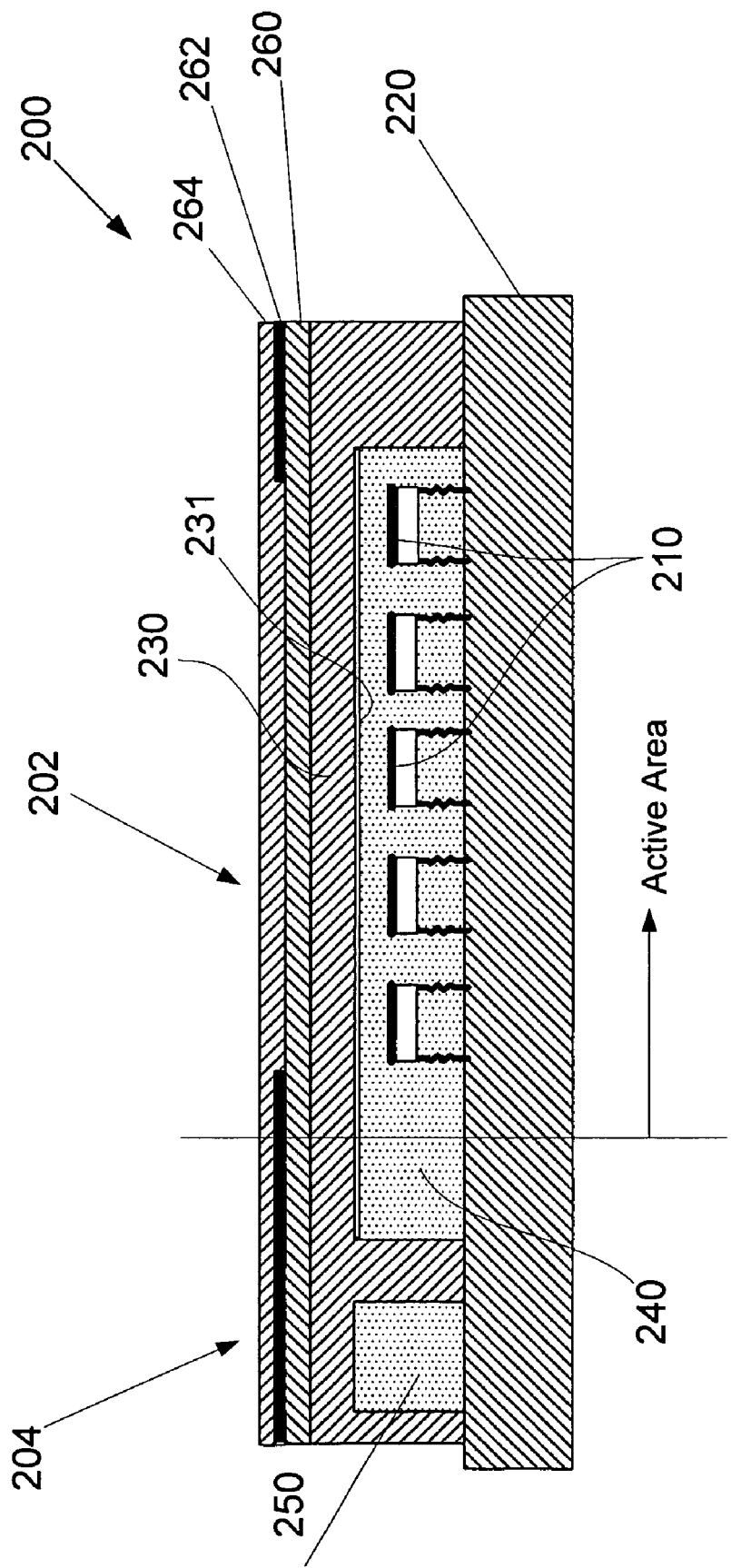
FIGS. 8-11 illustrate the construction and arrangement of another embodiment of the invention.
Figure 9:
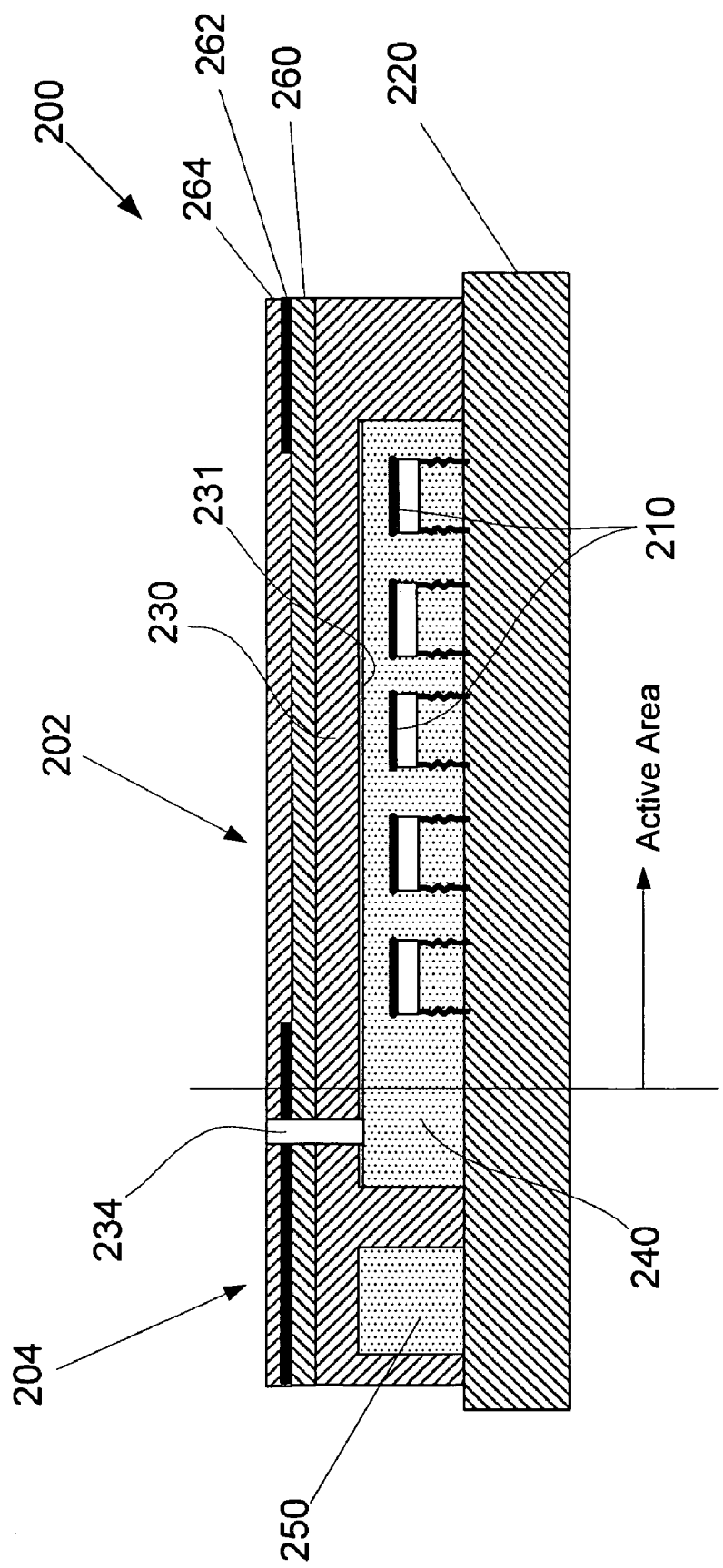
Figure 10:
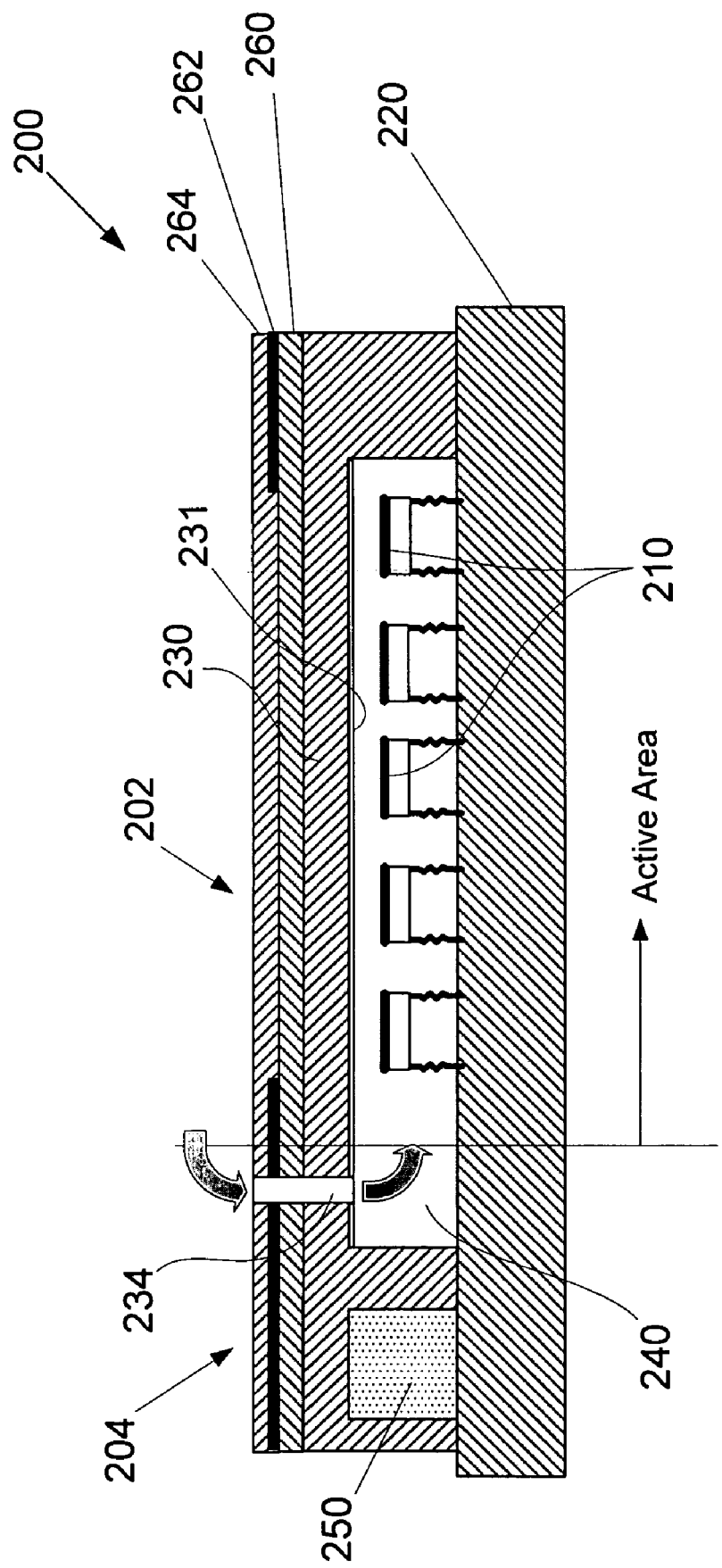
Figure 11:
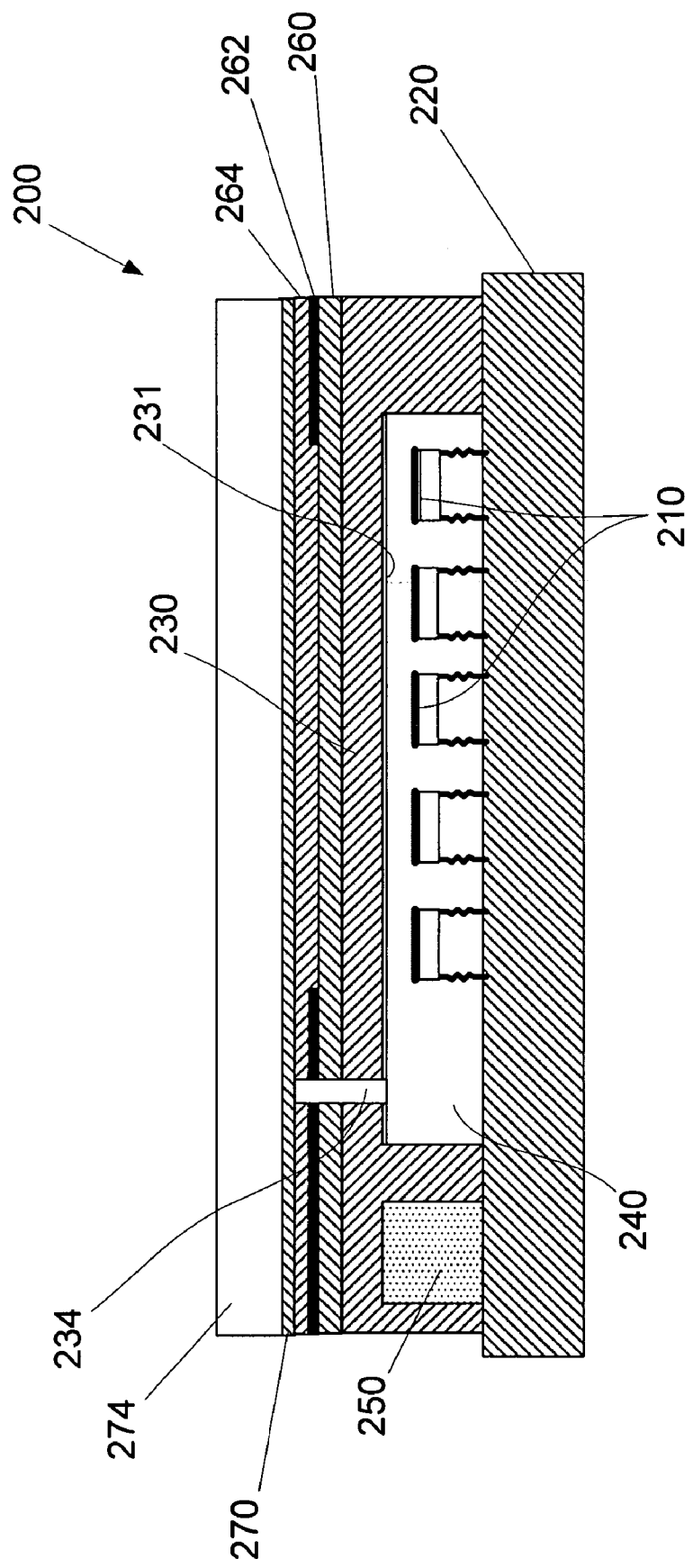

FIGS. 8-11 shows a further embodiment of the invention wherein the clear-out holes 232 are omitted and the fabrication of the DLD device is advance to the degree where the layers 260, 262, 264 are disposed on the protective membrane 230 with the protective sacrificial material still in place in the cavity 240 (see FIG. 8). The ambient port 234 is then formed (see FIG. 9).

At this stage it is possible to flow a gas (see flow arrows in FIG. 10), such as xenon difluoride ($XeF_2$) or the like, into the cavity 240 and remove the sacrificial material. This has the advantage of leaving the sacrificial material in position until the last minute and protecting the pixel elements from the high temperature (e.g. 400° C.) and/or plasma conditions which are involved with the formation of one or more of the layers 260, 262 and 264 and the formation of the ambient port. The ambient port 234 is then closed via the application of the cap in the manner shown in FIG. 11.

In a further embodiment, it is possible to introduce an anti-stiction material into the cavity 240. One example of such an anti-stiction material is FOTS (florininated octytrichlorosilane). This anti-stiction material can be used in combination with a contaminant absorbing material which is disposed in a recess portion of the lid 274, or can be used alone. That is to say, by using an anti-stiction material with hydrophobic properties, the pixel elements can be protected from the deleterious effects of moisture and the like in addition to being prevented from sticking due to the lubricating nature of the material.

The contamination of the upper surface of layer 264 by the anti-stiction material which occurs when introducing the material into the cavity 240, is conveniently removed by briefly introducing oxygen into the plasma chamber to produce a quick $O_2$ ash and then switching to nitrogen at the time of performing the surface plasma which is used to active the surface in preparation for bonding the lid into place. The removal of the anti-stiction material form the external surfaces does not markedly effect the interior of the cavity and no deleterious effect is had to the anti-stiction material within the cavity 240 per se.

At this stage it is possible to adjust the pressure and content of the atmosphere within the cavity, if so desired, and then bond the cap into position to hermetically close the ambient port.

It will be appreciated, the use of the anti-stiction material can be used alone as can the use of the contaminant absorbing material. Nevertheless, these two protective/prophylactic techniques can also be used in combination if so desired The foregoing description of embodiments of the invention have been presented for purposes of illustration and description. It is not intended to be exhaustive or to limit the invention to the precise form disclosed, and modifications and variation are possible in light of the above teachings or may be acquired from practice of the invention. The disclosed embodiments were chosen and described in order to explain the principles of the invention and its practical application to enable one skilled in the art to utilize the invention in various embodiments and with various modification as are suited to the particular use contemplated. It is intended that the scope of the invention be defined by the claims appended hereto and their equivalents.

What is claimed is:

1. A MEMS package, comprising:
a support base;
a MEMS cap forming a cavity with the support base, the cavity containing a plurality of MEMS actuators disposed on the support base therein;
an ambient port formed through the MEMS cap; and
a lid arrangement bonded to the MEMS cap, to hermetically close the ambient port;
a recess formed in the lid, the recess being configured to be in fluid communication with the ambient port; and
a contaminant absorbing material disposed in the recess.

2. A MEMS package as set forth in claim 1, wherein the ambient port is formed to open into the cavity at a location which is adjacent to and offset with respect to a location wherein the plurality of MEMS actuators are disposed.

3. A MEMS package as set forth in claim 1, further comprising a quantity of anti-stiction material disposed in the recess and enclosed therein by the lid.

4. A MEMS package as set forth in claim 1, further comprising an atmosphere enclosed in the cavity, the atmosphere having a content and pressure determined immediately prior closure of the ambient port by the lid.

5. A MEMS package set forth in claim 1, wherein the MEMS actuators include pixel plates forming a digital light display.

6. A MEMS package set forth in claim 1, wherein the contaminant absorbing material is a getter or a desiccant.

7. A MEMS package set forth in claim 1, wherein the contaminant absorbing material includes silicon dioxide.

8. A MEMS package, comprising:
   a support base:
      a MEMS cap means for forming a cavity with the support base which encloses a plurality of MEMS actuators disposed on the support base therein,
      ambient port means formed in the MEMS cap for providing fluid communication with the cavity;
   a lid arrangement bonded to the MEMS cap; and
   means for protecting the plurality of MEMS actuators from contaminants trapped in the cavity;
   wherein the protecting means comprises an absorbent material receiving means formed in the lid arrangement for receiving a contaminant absorbing material therein, the absorbent material receiving means being positioned to allow fluid communication between the contaminant absorbing material and the plurality of MEMS actuators through the ambient port.

9. The MEMS package as set forth in claim 8, wherein the contaminant absorbing material comprises a getter or a desiccant.

10. The MEMS package as set forth in claim 8, wherein the contaminant absorbing material comprises silicon dioxide.

11. The MEMS package as set forth in claim 8, wherein the protective means comprises a quantity of anti-stiction material which is introduced into the cavity through the ambient port.

\* \* \* \* \*